(12) United States Patent
Close et al.

(10) Patent No.: US 9,729,140 B2
(45) Date of Patent: Aug. 8, 2017

(54) CIRCUITS WITH FLOATING BIAS

(71) Applicant: Analog Devices, Inc., Norwood, MA (US)

(72) Inventors: JoAnn Close, Los Altos, CA (US); Jennifer W. Pierdomenico, Temple, PA (US); David Hall Whitney, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 66 days.

(21) Appl. No.: 14/197,818

(22) Filed: Mar. 5, 2014

(65) Prior Publication Data

US 2015/0256170 A1    Sep. 10, 2015

(51) Int. Cl.
*H03K 17/60*    (2006.01)
*H03K 17/56*    (2006.01)
*H03K 17/0812*    (2006.01)

(52) U.S. Cl.
CPC ......... *H03K 17/56* (2013.01); *H03K 17/0812* (2013.01); *H03K 17/60* (2013.01)

(58) Field of Classification Search
CPC ......... H01L 2924/00; H01L 2924/0002; H01L 29/7811; H01L 29/407; H01L 29/7813
See application file for complete search history.

(56) References Cited

U.S. PATENT DOCUMENTS

| | | | |
|---|---|---|---|
| 6,114,843 A * | 9/2000 | Olah | ............ G05F 1/465 323/280 |
| 6,956,727 B1 | 10/2005 | Brokaw | |
| 7,239,204 B2 | 7/2007 | Gammie et al. | |
| 7,821,333 B2 | 10/2010 | Yan et al. | |
| 8,902,005 B2 | 12/2014 | Wan | |
| 2004/0170067 A1* | 9/2004 | Kashiwazaki | ........... G11C 5/14 365/189.09 |
| 2006/0140039 A1* | 6/2006 | Lorenz | ..................... G11C 5/14 365/226 |
| 2007/0177323 A1* | 8/2007 | Sneep | .................... G11C 27/02 361/100 |
| 2008/0054949 A1* | 3/2008 | Pera | .................... H03F 3/45183 327/65 |
| 2014/0084999 A1* | 3/2014 | Wan | ......................... H03F 3/45 330/69 |
| 2015/0098281 A1* | 4/2015 | Byeon | .................... G11C 5/147 365/189.09 |

FOREIGN PATENT DOCUMENTS

| | | |
|---|---|---|
| CN | 1811977 A | 8/2006 |
| CN | 1961480 A | 5/2007 |

OTHER PUBLICATIONS

Analog Devices, Inc., High Common-Mode Voltage, Difference Amplifier, AD629 Data Sheet, Apr. 2011, 16 pages.
Office Action Received in Chinese Patent Application No. 201510097099.6, dated May 26, 2017.

* cited by examiner

*Primary Examiner* — Sibin Chen
(74) *Attorney, Agent, or Firm* — Knobbe, Martens, Olson & Bear, LLP

(57) ABSTRACT

Apparatus and methods to increase the range of a signal processing circuit. A system uses floating bias circuits coupled to a signal processing circuit to increase the range of power supplies that can be used with the signal processing circuit, while maintaining the components of the signal processing circuit within a breakdown voltage threshold. As the voltage level of the data signal varies, the voltage level of the floating bias circuits varies as well.

27 Claims, 6 Drawing Sheets

CIRCUITS WITH FLOATING BIAS

BACKGROUND

Field

Embodiments of the disclosure relate to electronics, and more particularly, in one or more embodiments, to circuits with a floating bias.

Description of the Related Technology

Circuit components, such as transistors, have breakdown voltages in which they stop functioning as intended and/or can be permanently damaged. The breakdown voltage of a circuit component is typically based on the manufacturing process used to manufacture the component, and different manufacturing processes can lead to different breakdown voltages. Thus, in situations where larger voltage supplies are needed, circuit components with a higher breakdown voltage are typically used. However, there are certain trade-offs that come with higher breakdown voltages. For example, as the breakdown voltage of a component increases, the maximum operating speed of the component can decrease. In addition, for transistors, a higher breakdown voltage can lead to an increased transistor collector resistance, which can result in poorer headroom. These trade-offs can become significant in systems that use high-voltage supplies and operate at high speeds.

SUMMARY

An electrical circuit or apparatus is described that includes one or more floating bias circuits that enable the componentry of a signal processing circuit to remain within its breakdown voltage threshold, while using larger power supplies.

In some embodiments, an apparatus is provided that includes a signal processing circuit, a first internal rail voltage circuit configured to receive a first power supply voltage and to provide a first internal rail voltage that varies in response to a change in the voltage of a data signal in the signal processing circuit, and a second internal rail voltage circuit configured to receive a second power supply voltage and to provide a second internal rail voltage that varies in response to the change in the voltage of the data signal in the signal processing circuit.

In certain embodiments, the signal processing circuit comprises transistors. In some embodiments, the signal processing circuit comprises bi-polar junction transistors. In certain embodiments, the first internal rail voltage circuit and the second internal rail voltage circuit each comprise a plurality of switch elements, a buffer, and a resistive element. In some embodiments, the resistive element comprises at least one of a resistor and a transistor. In certain embodiments, a voltage level at the first internal rail voltage circuit is approximately halfway between the first power supply voltage and the voltage of the data signal in the signal processing circuit. In some embodiments, a voltage level at the second internal rail voltage circuit is approximately halfway between the second power supply voltage and a voltage of the data signal in the signal processing circuit. In certain embodiments, a voltage difference between the first internal rail voltage circuit and the voltage of the data signal in the signal processing circuit is at most half of a breakdown voltage threshold of one or more components of the signal processing circuit. In some embodiments, a voltage difference between the second internal rail voltage circuit and the voltage of the data signal in the signal processing circuit is at most half of the breakdown voltage threshold of one or more components of the signal processing circuit. In certain embodiments, a voltage difference between the first power supply voltage and the second power supply voltage is greater than a breakdown voltage threshold of one or more components of the signal processing circuit. In some embodiments, a voltage difference between the first internal rail voltage and the second internal rail voltage circuit is less than or equal to a breakdown voltage threshold of one or more components of the signal processing circuit.

In certain embodiments, the apparatus further includes a third internal rail voltage circuit electrically coupled between a node of the first power supply voltage and the first internal rail voltage circuit, wherein the third internal rail voltage circuit is configured to provide a third internal rail voltage that varies in response to a change in the voltage of the data signal, and a fourth internal rail voltage circuit electrically coupled between a node of the second power supply voltage and the second internal rail voltage circuit, wherein the fourth internal rail voltage circuit is configured to provide a fourth internal rail voltage that varies in response to a change in the voltage of the data signal.

In some embodiments, a method for increasing a voltage range of a signal processing circuit is provided. The method can include providing a first internal rail voltage from a first internal rail voltage circuit to a signal processing circuit, wherein the first internal rail voltage varies in response to a change in a voltage of an output of the signal processing circuit, wherein the first internal rail voltage circuit is electrically coupled to the signal processing circuit and configured to receive a first power supply voltage, and providing a second internal rail voltage from a second internal rail voltage circuit to the signal processing circuit, wherein the second internal rail voltage varies in response to the change in the voltage of the output of the signal processing circuit, wherein the second internal rail voltage circuit is electrically coupled to the signal processing circuit and configured to receive a second power supply voltage.

In certain embodiments, the first internal rail voltage is less than the first power supply voltage and the second internal rail voltage is greater than the second power supply voltage. In some embodiments, a voltage level at the first internal rail voltage circuit is approximately halfway between the first power supply voltage and the voltage of the data signal in the signal processing circuit, and a voltage level at the second internal rail voltage circuit is approximately halfway between the second power supply voltage and a voltage of the data signal in the signal processing circuit. In certain embodiments, a voltage difference between the first internal rail voltage circuit and the voltage of the data signal in the signal processing circuit is at most half of a breakdown voltage threshold of one or more components of the signal processing circuit. In some embodiments, a voltage difference between the second internal rail voltage circuit and the voltage of the data signal in the signal processing circuit is at most half of the breakdown voltage threshold of one or more components of the signal processing circuit. In certain embodiments, a voltage difference between the first power supply voltage and the second power supply voltage is greater than a breakdown voltage threshold of one or more components of the signal processing circuit. In some embodiments, a voltage difference between the first internal rail voltage and the second internal rail voltage circuit is less than or equal to a breakdown voltage threshold of one or more components of the signal processing circuit.

In some embodiments described herein, an apparatus is provided that includes a signal processing circuit comprising a plurality of elements having a breakdown voltage threshold, one or more first internal rail voltage circuits coupled between a node for first power supply source and the signal processing circuit, and one or more second internal rail voltage circuits electrically coupled to a node for a second power supply source and the signal processing circuit. In certain embodiments, each of the one or more first internal rail voltage circuits and the one or more second internal rail voltages are configured to provide an internal rail voltage that varies in proportion to the change in the voltage of the data signal, and wherein the difference between the internal rail voltage of two second internal rail voltage circuits satisfies the breakdown voltage threshold.

In some embodiments described herein, an apparatus is provided that includes a signal processing circuit comprising a plurality of switch elements, a first internal rail voltage circuit electrically coupled to a first power supply source and a first set of switch elements of the signal processing circuit, wherein the first internal rail voltage circuit is configured to provide a first internal rail voltage that varies in proportion to a change in a voltage of a data signal, and a second internal rail voltage circuit electrically coupled to a second power supply source and a second set of switch elements of the signal processing circuit, wherein the second internal rail voltage circuit is configured to provide a second internal rail voltage that varies in proportion to the change in the voltage of the data signal.

DETAILED DESCRIPTION

Figure 1A:
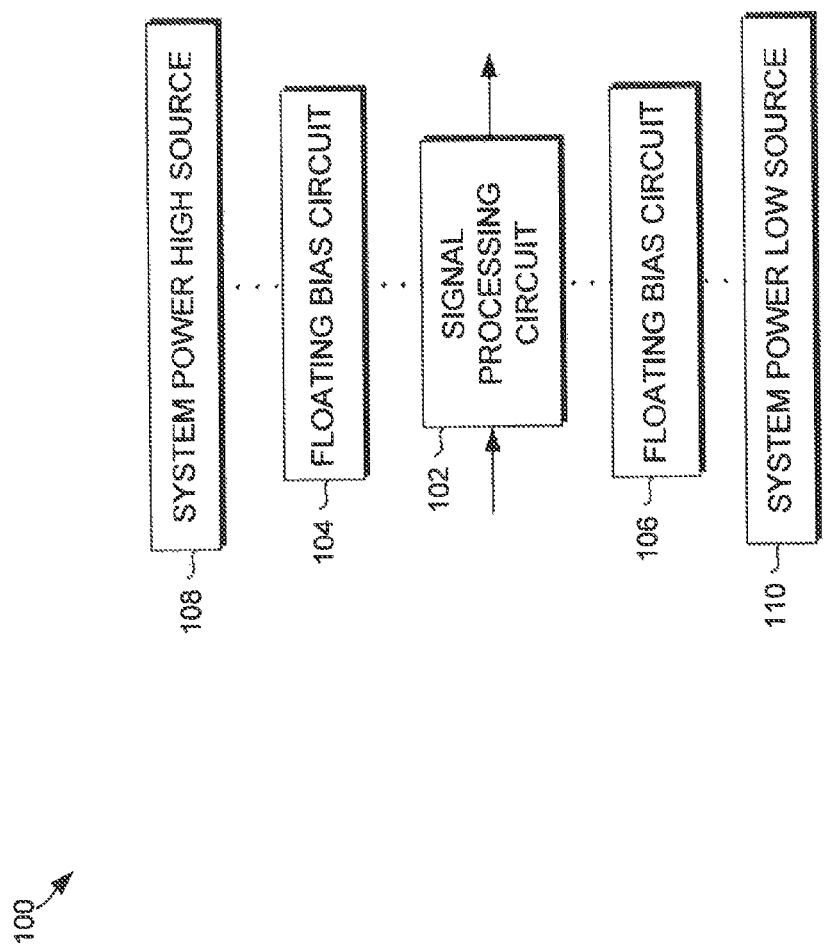
FIGS. 1A and 1B are schematic block diagrams of embodiments of a system that includes one or more floating bias circuits for a signal processing circuit.

The following detailed description of certain embodiments presents various descriptions of specific embodiments of the disclosure. However, the other embodiments of the disclosure can be implemented in a multitude of different ways as defined and covered by the claims. In this description, reference is made to the drawings where like reference numerals may indicate similar elements.

FIG. 1A is a schematic block diagram of an embodiment of a system 100 for generating one or more internal rail voltages that can vary based at least in part on the voltage level of a data signal at a node (also referred to herein as floating biases). In some embodiments, the one or more internal rail voltages vary in proportion to the voltage level of the data signal at a node. The system 100 can advantageously permit a signal processing circuit 102 to operate beyond a given process breakdown voltage threshold, and can include the signal processing circuit 102, the floating bias circuits 104, 106 (also referred to as internal rail voltage circuits), a system power high source 108 (also referred to as a first power supply source), and a system power low source 110 (also referred to as a second power supply source). The system power high source 108 and the system power low source 110 can be electrically connected to contacts of a package of an integrated circuit to receive the appropriate voltage biases from one or more power supplies. The floating bias circuit/internal rail voltage circuit 104 can be electrically coupled to the system power high source 108 and the signal processing circuit 102, and the floating bias circuit/internal rail voltage circuit 106 can be electrically coupled to the system power low source 110 and the signal processing circuit 102.

In some embodiments, the system power high source 108 can be a maximum voltage provided by a power supply of the system 100. In certain embodiments, the system power high source 108 can be a voltage other than the maximum voltage provided by the power supply. In some embodiments, the system power low source 110 can be a minimum voltage provided by a power supply of the system 100. In certain embodiments, the system power low source 110 can be a voltage other than the minimum voltage provided by the power supply. For example, in some embodiments, the system power high source 108 can be 24V and the system power low source 110 can be −24V. However, in some embodiments, the system power high source 108 can be less than the maximum voltage of a power supply, and the system power low source 110 can be greater than the minimum voltage of a power supply. For example, if the power supply is a 36V DC power supply, the system power high source 108 can be configured to be 30V and the system power low source 110 can be configured to be 5V. Any combination of the above-described embodiments can be used as desired.

The signal processing circuit 102 can be used to process an incoming signal, and can be implemented using a variety of circuit topologies. For example, the signal processing circuit 102 can be implemented as a translinear loop circuit, a current feedback amplifier, or other amplifier circuit. In some embodiments, the signal processing circuit 102 can correspond to an input stage and/or an output stage of an integrated circuit as described in greater detail below with reference to FIG. 4. Accordingly, in some embodiments, the system 100 can increase the input common-mode range of a circuit, and, in certain embodiments, the system 100 can increase the size of a data signal voltage swing that a circuit can tolerate.

In some embodiments the signal processing circuit 102 can be implemented using a variety of elements, such as transistors (e.g. field-effect transistors (FETs), metal-oxide semiconductor FETs (MOSFETs), power MOSFETs, bipolar junction transistors (BJTs), insulated-gate bipolar transistor (IGBT), etc.), resistors, and the like, as will be described in greater detail below with reference to FIG. 2. While the terms "metal" and "oxide" are present in the name of the MOSFET, it will be understood that these transistors can have gates made out of materials other than metals, such as polycrystalline silicon, and can have dielectric "oxide" regions made from dielectrics other than silicon oxide, such as from silicon nitride or high-k dielectrics. As mentioned previously, the components (e.g., transistors) of the signal processing circuit 102 have breakdown voltage thresholds that, when exceeded, cause the signal processing circuit 102 to stop functioning as intended (e.g., stop functioning completely and/or decrease accuracy, introduce error, etc.).

In some embodiments, the voltage difference between the system power high source 108 and the system power low source 110 does not satisfy the breakdown voltage threshold of the components in the signal processing circuit 102. In such cases, the floating bias circuits 104, 106 can be used to enable the signal processing circuit 102 to function properly. In some embodiments, the voltage difference between the two floating bias circuits that are closest to the signal processing circuit 102 (or one floating bias circuit and one of the system power high source 108 and the system power low source 110) satisfies the breakdown voltage threshold, thereby enabling the signal processing circuit 102 to function properly.

Furthermore, the floating bias circuits 104, 106 can be used to maintain the components of the signal processing circuit 102 within their breakdown voltage threshold or satisfy the breakdown voltage threshold of the components of the signal processing circuit 102, while increasing the range of power supplies that can be used with the signal processing circuit 102. In some embodiments, the floating bias circuits 104, 106 can be implemented using switch elements, such as transistors (e.g. FETS, MOSFETS, power FETS, BJTs, etc.), buffers, resistive elements (e.g., resistors, transistors), and the like. Similar to the components of the signal processing circuit 102, the components of the floating bias circuits 104, 106 can have breakdown voltage thresholds. In some embodiments, the breakdown voltage thresholds of the components of the floating bias circuits 104, 106 can be the same as, or approximately equal to, the breakdown voltage thresholds of the components of the signal processing circuit 102. In certain embodiments, the breakdown voltage thresholds of the components of the floating bias circuits 104, 106 can different than the breakdown voltage thresholds of the components of the signal processing circuit 102 (e.g., larger and/or smaller).

The floating bias circuit 104 can be electrically coupled to the system power high source 108 and the signal processing circuit 102, and can be configured to provide a voltage to the signal processing circuit 102 that is lower than the voltage of the system power high source 108. In some embodiments, the voltage level of the floating bias circuit 104 (e.g., at a node of the floating bias circuit 104) is midway, or approximately midway, between the voltage level of the system power high source 108 and the voltage level of the signal processing circuit 102 (e.g., a voltage level of a data signal at a node of the signal processing circuit 102) and can vary as the voltage level of the signal processing circuit 102 varies (e.g., can vary as the voltage level of an input node, output node $V_{OUT}$, or some other node varies, or as the voltage level of a data signal at a node varies, as desired). In addition, the floating bias circuit 104 can provide a fixed DC current to the signal processing circuit 102.

Similarly, the floating bias circuit 106 can be electrically coupled with the system power low source 110 and the signal processing circuit 102, and can be configured to provide a voltage to the signal processing circuit 102 that is higher than the voltage of the system power low source 110. In some embodiments, the voltage level of the floating bias circuit 106 (e.g., at a node of the floating bias circuit 106) can be midway, or approximately midway, between the voltage level of the system power low source 110 and the voltage level of the signal processing circuit 102 (e.g., as the voltage level of a data signal at a node of the signal processing circuit 102 varies) and can vary as the voltage level of the signal processing circuit 102 varies (e.g., as the voltage level of an input node, output node $V_{OUT}$ varies, or some other node as desired). In addition, the floating bias circuit 106 can provide a fixed DC current to the signal processing circuit 102.

In some embodiments, the floating bias circuit 104 can provide a voltage drop between the system power high source 108 and the signal processing circuit 102, and the floating bias circuit 106 can provide a voltage drop between the signal processing circuit 102 and the system power low source 110. For example, in certain embodiments, the floating bias circuit 104 can provide a 50% voltage drop between the system power high source 108 and the signal processing circuit 102 and the floating bias circuit 106 can provide a 50% voltage drop between the signal processing circuit 102 and the system power low source 110. In some embodiments, the floating bias circuit 104 and/or the floating bias circuit 106 can provide a 50% voltage drop between two floating biasing circuits and/or between one floating bias circuit and any one, or a combination, of the system power high source 108, the system power low source 110, and the signal processing circuit 102. Other bias levels will be readily determined by one of ordinary skill in the art. For example, in some embodiments, the floating bias circuits 104, 106 can be used and configured to provide a 40%, 60%, or other voltage drop between components, as desired.

In this way, the floating bias circuits 104, 106 can effectively double, or otherwise expand, the range of power supplies that can be used with the signal processing circuit 102. For example, if some components in the signal processing circuit 102 have a breakdown voltage threshold of 18V and the system uses a 36V DC power supply (e.g., the system power high source 108 has a voltage of 36V and the system power low source 110 has a voltage of 0V), the voltage level at the floating bias circuit 104 (e.g., at a node of the floating bias circuit 104) can be 27V and the voltage level at the floating bias circuit 106 (e.g., at a node of the floating bias circuit 106) can be 9V. Thus, the components of the signal processing circuit are exposed to an 18V differential (9V to 27V) rather than a 36V differential (0V to 36V), thereby satisfying the breakdown voltage threshold. Accordingly, a relatively large power supply voltage (e.g., 36V) can be used with components of the signal processing circuit 102 that have a lower breakdown voltage threshold (e.g., 18V).

Similarly, the floating bias circuits 104, 106 can increase the voltage swing range of the components of the signal processing circuit 102. For example, if components of the signal processing circuit 102 have a breakdown voltage threshold of 19V, and are used with a 19V power supply, the components can have voltage swing of less than or equal to 19V (e.g., 0V-19V). However, by including the floating bias circuits 104, 106, not only can the components of the signal processing circuit 102 be used with a larger power supply (e.g., 35V, etc.), but the voltage swing range of the components can also increase (e.g., ~6V-~33V).

Furthermore, as the voltage level of the data signal in the signal processing circuit 102 changes (e.g., the voltage of the data signal at a reference node, such as the output node $V_{OUT}$, an input node, some other node, etc.), the voltage levels of the floating bias circuits 104, 106 can change as well. For example, if the voltage level at a reference node changes from 18V to 12V, the voltage level of the floating bias circuit 104 (e.g., at a node of the floating bias circuit 104) can swing to 24V and the voltage level of the floating bias circuit 106 (e.g., at a node of the floating bias circuit 106) can swing to 6V. In this way, the components of the signal processing circuit 102 can be maintained within their breakdown voltage threshold (e.g., the voltage difference satisfies the breakdown voltage threshold). Similarly, the components of the floating bias circuits 104, 106 can also be maintained within their breakdown voltage.

Although the system 100 of FIG. 1A illustrates a single floating bias circuit 104 between the system power high source 108 and the signal processing circuit 102, it will be understood that, as indicated by the dotted lines, multiple floating bias circuits 104 can be placed between the system power high source 108 and the signal processing circuit 102 in a series stack. Similarly, multiple floating bias circuits 106 can be placed between the system power low source 110 and the signal processing circuit 102 in a series stack.

The additional floating bias circuits can enable even larger power supplies to be used with a given signal processing circuit 102, as well as further increasing the voltage swing range, while maintaining the components of the signal processing circuit 102 and floating bias circuits within their breakdown voltage thresholds. For example, if the breakdown voltage threshold for certain components of the signal processing circuit 102 is 12V, the voltage level of the system power high source 108 is 18V, and the voltage level of the system power low source 110 is −18V, the system 100 can include four floating bias circuits: two floating bias circuits between the system power high source 108 that have a voltage level at 6V and 12V (e.g., at a node of the floating bias circuits), respectively, and two floating bias circuits between the system power low source 110 that have a voltage level at −6V and −12V (e.g., at a node of the floating bias circuits), respectively. The signal processing circuit 102 can be coupled to the floating bias circuits having the 6V and −6V voltage levels. In this way, the components of the signal processing circuit 102 can operate within the 12V breakdown voltage threshold. It will be understood that the breakdown voltage for a component can be different than 12V, and can be based at least in part on the manufacturing processes used to build the component. In addition, as discussed previously, the components in the floating bias circuits can have a breakdown voltage threshold that is the same as, or different from, the breakdown voltage threshold of the components of the signal processing circuit 102.

As described previously, as the voltage level of the data signal varies, the voltage levels of the floating bias circuits (e.g., at a node of the floating bias circuits) can vary as well, thereby maintaining the components of the signal processing circuit 102 within the breakdown voltage threshold. In some embodiments, the signal at the output node $V_{OUT}$ is used to vary the voltage levels of the floating bias circuits. In certain embodiments, the voltage level of the data signal at an input node is used to vary the voltage levels of the floating bias circuits. It will be understood that additional floating bias circuits can be used as desired.

In some embodiments, a minimum number of floating bias circuits for a system 100 can be determined based at least in part on the breakdown voltage threshold of the components of the signal processing circuit 102 and/or the components of the floating bias circuits and the voltage level of the power supply used by the system 100 (e.g., power supply/((breakdown voltage threshold/2)−2) or power supply/breakdown voltage threshold). In some embodiments, a maximum voltage step between the floating bias circuits above the signal processing circuit 102 (e.g., floating bias circuits between the system power high source 108 and the signal processing circuit 102) and between the floating bias circuits below the signal processing circuit 102 (e.g., floating bias circuits between the system power low source 110 and the signal processing circuit 102) can be based at least in part on the breakdown voltage threshold of the components of the signal processing circuit 102 and/or the components of the floating bias circuits (e.g., breakdown voltage threshold/2).

Figure 1B:
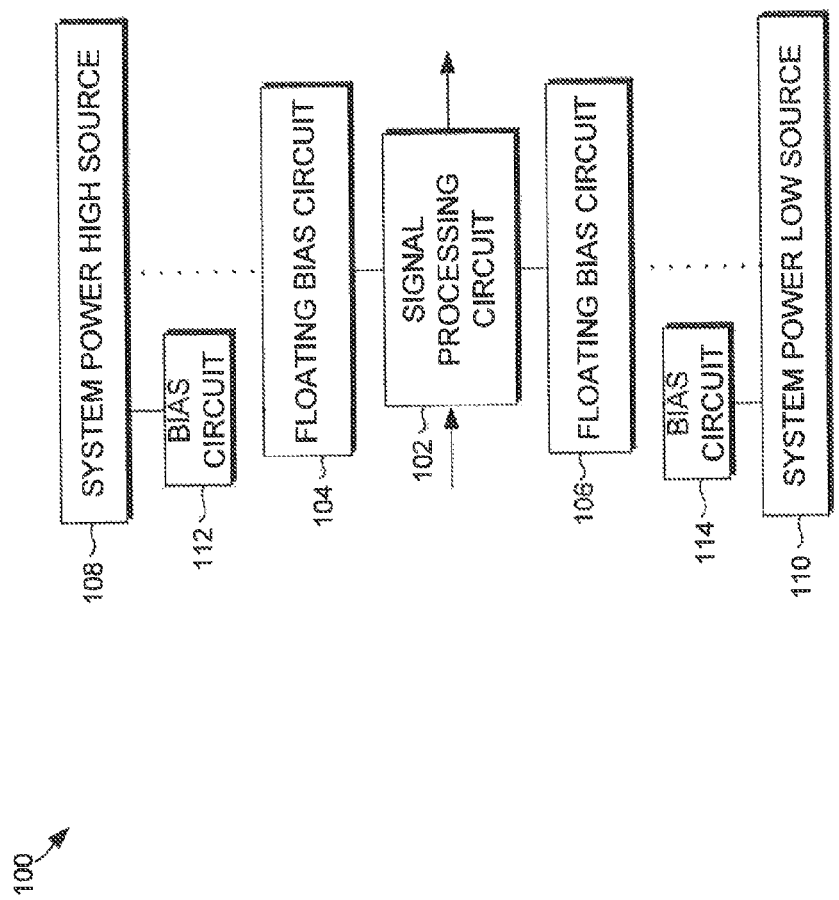

FIG. 1B is a schematic block diagram of an embodiment of a system 100 including one or more floating bias circuits 104, 106 electrically coupled with a signal processing circuit 102. In addition, the system 100 in the illustrated embodiment of FIG. 1B includes bias circuits 112, 114. It will be understood that fewer, more, or different bias circuits can be used in the system 100 as desired. The bias circuit 112 can be electrically coupled with the system power high source 108 and the floating bias circuit 104, and the bias circuit 114 can be electrically coupled with the system power low source 110 and the floating bias circuit 106. It will be understood that the bias circuits 112, 114 can be placed in different locations, as desired. For example, in some embodiments, the bias circuit 112 can be placed between the signal processing circuit 102 and the floating bias circuit 104, and/or the bias circuit 114 can be placed between the signal processing circuit 102 and the floating bias circuit 106. The bias circuits 112, 114 can be used to maintain the components in the floating bias circuits 104, 106 at proper operating conditions (e.g., at predetermined voltages or currents).

Figure 2:
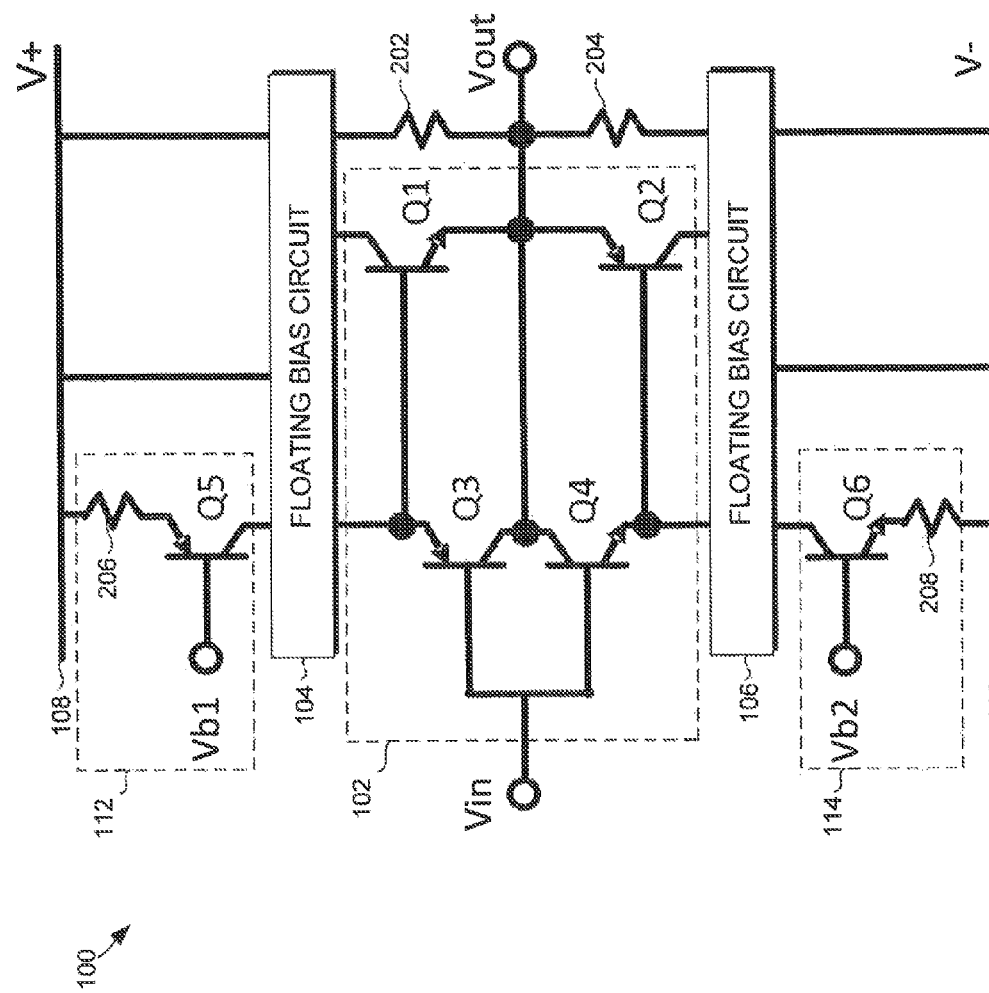
FIG. 2 is a schematic block diagram illustrating an embodiment of a signal processing circuit and bias circuits.

FIG. 2 is a schematic block diagram illustrating embodiments of a signal processing circuit 102 and bias circuits 112, 114 in the system 100. As described previously, the signal processing circuit 102 can be used to process an incoming signal, and the bias circuits 112, 114 can be used to maintain the components of the floating bias circuits 104, 106 at proper operating conditions.

In the illustrated embodiment, the resistors 202, 204 can be located between the output node $V_{OUT}$ and the floating bias circuit 104 and between the output node $V_{OUT}$ and the floating bias circuit 106, respectively. In some embodiments, the resistors 202, 204 can be considered part of the signal processing circuit 102, part of the floating bias circuits 104, 106, and/or as separate circuits or components. The resistors 202, 204 can be used as a voltage divider between the output node $V_{OUT}$ and the floating bias circuits 104, 106, respectively. In some embodiments, the resistors 202, 204 can be replaced with other resistive elements, such as transistors (FETs, MOSFETs, BJTs, JFETs, etc.) or other components or voltage dividers.

In addition, in the illustrated embodiment of FIG. 2, the signal processing circuit 102 can include multiple switch elements, such as transistors Q1, Q2, Q3, Q4 arranged as a translinear loop circuit. Accordingly, in some embodiments, an input node $V_{IN}$ can be electrically coupled to the base/gate of the transistors Q3, Q4, the collector/drain of the transistors Q3, Q4 can be electrically coupled to each other, the emitter/source of the transistors Q1, Q2, and the output node $V_{OUT}$, and the emitter/source of the transistors Q3, Q4 can be electrically coupled to the base/gate of the transistors Q1, Q2, respectively. Although the transistors Q1, Q2, Q3, Q4 are illustrated as BJTs, it will be understood that the transistors Q1, Q2, Q3, Q4 can be implemented using any number of transistor topologies, such as, but not limited to, PNP-type transistors, NPN-type transistors, MOSFETs, FETs, IBGTs, JFETs, etc. Furthermore, it will be understood that other types of circuits can be used as the signal processing circuit 102 in place of the translinear loop circuit, such as, but not limited to, a current feedback amplifier, or other amplifier circuit.

In the illustrated embodiment of FIG. 2, the bias circuit 112 can be implemented using a voltage bias source Vb1, a transistor Q5, and a resistor 206. However, it will be understood that fewer, more, or different components can be used in the bias circuit 112, as desired. In some embodiments, the resistor 206 can be electrically coupled in series with the system power high source 108 and the emitter/source of the transistor Q5. In such embodiments, the collector/drain of the transistor Q5 can be electrically coupled with the floating bias circuit 104. However, as described previously, in some embodiments, the bias circuit 112 can be located between the floating bias circuit 104 and the signal processing circuit 102 as desired. In such embodiments, one end of the resistor 206 can be electrically coupled to the floating bias circuit 104 and the transistor Q5 can be electrically coupled to the signal processing circuit 102.

Similarly, the bias circuit 114 can be implemented using a voltage bias source Vb2, a transistor Q6, and a resistor 208. However, it will be understood that fewer, more, or different components can be used in the bias circuit 114, as desired. In some embodiments, the resistor 208 can be electrically coupled in series with the system power low source 110 and the emitter/source of the transistor Q6. In such embodiments, the collector/drain of the transistor Q6 can be electrically coupled with the floating bias circuit 106. However, as described previously, in some embodiments, the bias circuit 114 can be located between the floating bias circuit 106 and the signal processing circuit 102 as desired. In such embodiments, one end of the resistor 208 can be electrically coupled to the floating bias circuit 106 and the transistor Q6 can be electrically coupled to the signal processing circuit 102.

It will be understood that the bias circuits 112, 114 can be implemented a variety of ways, without departing from the spirit of the description. For example, in some embodiments, the resistor 208 can be replaced with another resistive element, such as a transistor. Furthermore, the transistors Q5 and Q6, can be implemented as NPN-type or PNP type BJTs (as illustrated), FETs, MOSFETs, IGBTs, JFETs, etc. Furthermore, in certain instances, the bias circuits 112, 114 can be implemented as current sources.

Figure 3:
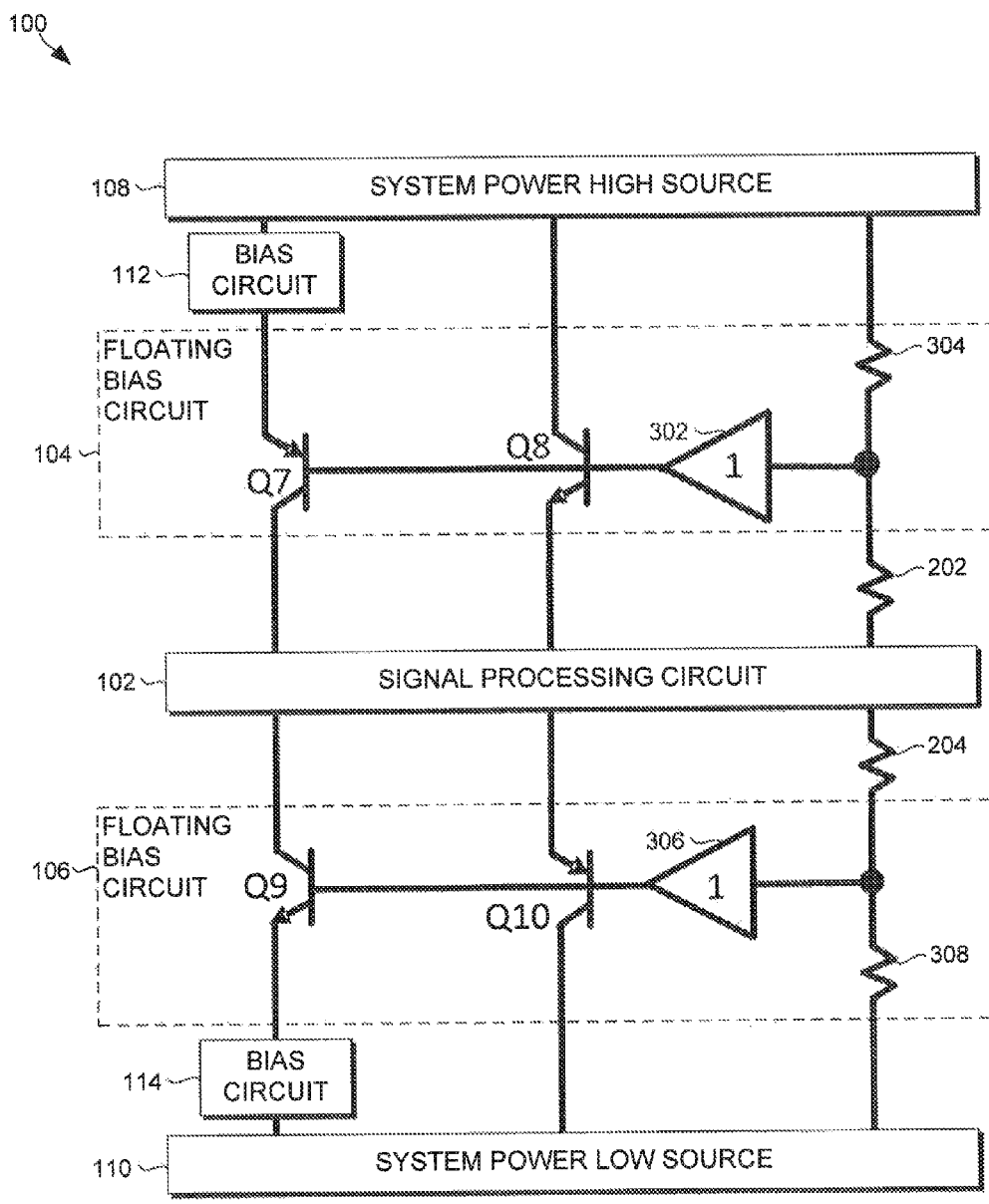
FIG. 3 is a block diagram illustrating embodiments of floating bias circuits.

FIG. 3 is a schematic block diagram illustrating embodiments of floating bias circuits 104, 106 in the system 100. As mentioned previously, the floating bias circuit 104 can be electrically coupled to the system power high source 108 and/or the bias circuit 112, and the signal processing circuit 102, and the floating bias circuit 106 can be electrically coupled to the system power low source 110 and/or the bias circuit 114, and the signal processing circuit 102. However, as mentioned previously, the bias circuits 112, 114 can be placed in different locations. For example, in some embodiments, the bias circuit 112 can be located between the floating bias circuit 104 and the signal processing circuit 102. In such embodiments, a different type of transistor Q7 can be used, such as an NPN-type transistor. Similarly, in certain embodiments, the bias circuit 114 can be located between the floating bias circuit 106 and the signal processing circuit 102. In such embodiments, a different type of transistor Q9 can be used, such as a PNP-type transistor.

In the illustrated embodiment of FIG. 3, the floating bias circuit 104 includes switch elements, implemented as transistors Q7, Q8, a buffer circuit 302, and a resistor 304. However, it will be understood that fewer, more, or different components can be used in the floating bias circuit 104, as desired. For example, the resistor 304 can be implemented using other resistive elements, such as a transistor, and fewer or more transistors can be used based on the configuration of the signal processing circuit 102.

In some embodiments, the resistor 304 can be electrically coupled in series with the system power high source 108 and the input of the buffer circuit 302, as well as the signal processing circuit 102 (or resistor 202). The output of the buffer circuit 302 can be electrically coupled with the base/gate of the transistors Q7 and Q8. In this way, the voltage at the base/gate of the transistors Q7 and Q8 can be equal or approximately equal. Accordingly, in some embodiments, the input of the buffer circuit 302, an end of the resistor 304 and a portion of the signal processing circuit 102 (e.g., an end of the resistor 202 that is distal to the output node $V_{OUT}$) can be electrically coupled via an electrical node. In this way, the voltage level at the floating bias circuit 104 (e.g., at a node of the floating bias circuit 104, such as at the input and/or output of the buffer 302) can vary based at least in part on the voltage level at the signal processing circuit 102 (e.g., the voltage level of the data signal at the output node $V_{OUT}$, or other node from the signal processing circuit 102 that is electrically coupled via one or more resistive elements to the input of the buffer circuit 302). Similarly, the output of the buffer circuit 302 and the base/gate of the transistors Q7 and Q8 can be electrically coupled via another electrical node.

In some embodiments, the emitter/source of the transistor Q7 can be electrically coupled with the bias circuit 112, the system power high source 108, another floating bias circuit, and/or other components of a circuit in which the floating bias circuit 104 is implemented. In such embodiments, the collector/drain of the transistor Q7 can be electrically coupled with the signal processing circuit 102, another floating bias circuit, and/or other components of a circuit in which the floating bias circuit 104 is implemented. In certain embodiments, the collector/drain of the transistor Q8 can be electrically coupled with the system power high source 108, another floating bias circuit, and/or other components of a circuit in which the floating bias circuit 104 is implemented. In such embodiments, the emitter/source of the transistor Q8 can be electrically coupled with the signal processing circuit 102, another floating bias circuit, and/or other components of a circuit in which the floating bias circuit 104 is implemented.

It will be understood that the components of the floating bias circuit 104 can be implemented in a variety of ways. For example, in some embodiments, the transistor Q7 can be implemented as a PNP transistor, and the transistor Q8 can be implemented as an NPN transistor. However, it will be understood that different types and arrangements of switch elements can be used as desired. For example, the transistors Q7 and Q8, can be implemented as NPN-type or PNP type BJTs (as illustrated), FETs, MOSFETs, IGBTs, etc. In addition, in some embodiments, the buffer circuit 302 can be implemented using an operational amplifier and/or a transistor. In certain embodiments, the buffer circuit 302 can be implemented as a unity gain amplifier or voltage follower. In some embodiments, the buffer circuit 302 can be implemented as a four-transistor buffer circuit using the same, or similar, configuration as the transistors Q1, Q2, Q3, Q4 of FIG. 2, and as described in greater detail below with reference to FIG. 5. Furthermore, it will be understood that the resistors 304, 308 can be implemented using other resistive elements, such as, but not limited to, transistors.

Based on its configuration, the floating bias circuit 104 can provide a voltage drop between two components of the system 100 (e.g., between the system power high source 108 and the signal processing circuit 102, between two floating bias circuits, and/or between a floating bias circuit and one of the system power high source 108 and the signal processing circuit 102). For example, in some embodiments, the floating bias circuit 104 can provide a 50% voltage drop between two components of the system 100.

In certain embodiments, the voltage level at the floating bias circuit 104 (e.g., at the input and/or output of the buffer 302 of the floating bias circuit 104) can be midway between the voltage level of the signal processing circuit 102 (or the voltage level of a proximate floating bias circuit 104 that is closer to the signal processing circuit 102) and the voltage level of the system power high source 108 (or the voltage level of a proximate floating bias circuit 104 that is closer to the system power high source 108). The difference between the voltage level of the system power high source 108 and the voltage level of the signal processing circuit 102 can also be referred to herein as the high source-circuit voltage difference.

By providing a voltage drop between two components of the system 100, the floating bias circuit 106 can reduce the voltage differential at the components of the signal processing circuit 102, thereby maintaining the components of the signal processing circuit 102 within their breakdown voltage threshold.

Due to the configuration of the floating bias circuit 104, a variation in the voltage level at the signal processing circuit 102 (e.g., due to a data signal) can result in a change of the voltage level at the floating bias circuit 104 (e.g., at the input and/or output of the buffer 302 of the floating bias circuit 104). For example, if the voltage level at the signal processing circuit 102 decreases/increases by 5V, the voltage level at the floating bias circuit 104 can decrease/increase by 2.5V. In this way the voltage level at the floating bias circuit 104 can remain midway, or approximately midway, between the voltage level of the system power high source 108 and the voltage level at the signal processing circuit 102, and can provide a lower voltage to the signal processing circuit 102.

In embodiments where multiple floating bias circuits are used between the signal processing circuit 102 and the system power high source 108, the percentage of the high source-circuit voltage difference that is between the voltage level of each floating bias circuit can be calculated as 100/(number of floating bias circuits+1). Thus, if two floating bias circuits 104 are used between the signal processing circuit 102 and the system power high source 108, the percentage of the high source-circuit voltage difference that is between the voltage level of the signal processing circuit and the first floating bias circuit can be 33%, or approximately 33%, the percentage of the high source-circuit voltage difference between the voltage level of the first floating bias circuit and the second floating bias circuit can be 33%, or approximately 33%, and the percentage of the high source-circuit voltage difference between the voltage level of the second floating bias circuit and the system power high source 108 can be 33%, or approximately 33%. Similarly, with three floating bias circuits between the signal processing circuit 102 and the system power high source 108, the percentage of the high source-circuit voltage difference between each floating bias circuit can be calculated as 25% or approximately 25%, and so on. Furthermore, as the voltage level of the data signal varies, the percentage of the high source-circuit voltage difference that is between the voltage levels of each floating bias circuit can remain relatively constant.

The size of the voltage step between each floating bias circuit that is between the signal processing circuit 102 and the system power high source 108 can be calculated as (high source-circuit voltage difference)/(number of floating bias circuits+1). Furthermore, the voltage step between each floating bias circuit that is between the signal processing circuit 102 and the system power high source 108 can vary as the voltage level of the data signal varies.

In addition, in some embodiments, such as when an equal number of floating bias circuits is desired on either side of the signal processing circuit 102, a minimum number of floating bias circuits between the system power high source 108 and the signal processing circuit 102 can be calculated as (high source-circuit voltage difference/(breakdown voltage threshold/2))−1. In certain embodiments, the user can determine the number of floating bias circuits to locate between the system power high source 108 and the signal processing circuit 102, based at least in part on the total number of floating bias circuits to use in the system. In some embodiments, a maximum voltage step between each floating bias circuit that is between the signal processing circuit 102 and the system power high source 108 can be calculated based at least in part on the breakdown voltage of the components of the signal processing system 102 and/or the components of the floating bias circuits (e.g., breakdown voltage threshold/2).

As a non-limiting example, a 54V DC power supply can be used in conjunction with a data signal having a 27V common mode voltage and a signal processing circuit 102 that includes components with an 18V breakdown voltage threshold. In addition, a user may desire there be a symmetrical number of floating bias circuits on either side of the signal processing circuit 102. In this example, the maximum voltage step between the floating bias circuits can be calculated as 18V/2=9V, and the minimum number of floating bias circuits between the system power high source 108 and the signal processing circuit 102 can be calculated as (54−27)/(18/2)−1=2. Accordingly, the system 100 can include two floating bias circuits (first and second floating bias circuits) between the signal processing circuit 102 and the system power high source 108.

The percentage of the high source-circuit voltage difference (27V) between the voltage level of the first and second floating bias circuits can be 33%, or 9V. Similarly, the percentage of the high source-circuit voltage difference between the signal processing circuit 102 and the second floating bias circuit and between the first floating bias circuit and the system power high source 108 can each be 33%, or 9V. Accordingly, the voltage level at the signal processing circuit 102 can be 27V, the voltage level at the second floating bias circuit can be 36V, and the voltage level at the first floating bias circuit can be 45V.

As the voltage of the data signal varies, the percentage of the high source-circuit voltage difference that is between circuits can remain relatively constant. For example, if the data signal voltage drops to 21V, the percentage of the high source-circuit voltage difference that is between the different circuits can remain at 33%. However, while the percentage of the high source-circuit voltage difference that is between the voltage level of the different circuits can remain relatively constant (e.g., 33%), the voltage step between the different circuits can change from 9V to 11V (54−21)/(2+1)=11).

The floating bias circuit 106 can be implemented in a manner similar to the floating bias circuit 104 described above. For example, the floating bias circuit 106 can include transistors (or other switch elements) Q9, Q10, a buffer circuit 306, and a resistor 308. However, it will be understood that fewer, more, or different components can be used in the floating bias circuit 106, as described above with reference to floating bias circuit 104.

Similar to the resistor 304, the resistor 308 can be can be electrically coupled in series with the system power low source 110 and the input of the buffer circuit 306, as well as the signal processing circuit 102 (or the resistor 204). The output of the buffer circuit 306 can be electrically coupled with the base/gate of the transistors Q9 and Q10. In this way, the voltage at the base/gate of the transistors Q9 and Q10 can be equal or approximately equal. Accordingly, in some embodiments, the input of the buffer circuit 306, an end of the resistor 308 and a portion of the signal processing circuit 102 (e.g., an end of the resistor 204 that is distal to the output node $V_{OUT}$ or other node of the signal processing circuit 102) can be electrically coupled via an electrical node. In this way, the voltage level at the floating bias circuit 106 (e.g., at a node of the floating bias circuit 106, such as the input and/or output of the buffer 306) can vary based at least in part on the voltage level at the signal processing circuit 102 (e.g., the voltage level of the data signal at the output node $V_{OUT}$, or other node from the signal processing circuit 102 that is electrically coupled via one or more resistive elements to the input of the buffer circuit 306). Similarly, the output of the buffer circuit 306 and the base/gate of the transistors Q9 and Q10 can be electrically coupled via another electrical node.

In some embodiments, the emitter/source of the transistor Q9 can be electrically coupled with the bias circuit 114, the system power low source 110, another floating bias circuit, and/or other components of a circuit in which the floating bias circuit 106 is implemented. In such embodiments, the collector/drain of the transistor Q9 can be electrically coupled with the signal processing circuit 102, another floating bias circuit, and/or other components of a circuit in which the floating bias circuit 106 is implemented. In certain embodiments, the collector/drain of the transistor Q10 can be electrically coupled with the system power low source 110, another floating bias circuit, and/or other components of a circuit in which the floating bias circuit 106 is implemented. In such embodiments, the emitter/source of the transistor Q10 can be electrically coupled with the signal processing circuit 102, another floating bias circuit, and/or other components of a circuit in which the floating bias circuit 106 is implemented.

It will be understood that the components of the floating bias circuit 106 can be implemented in a variety of ways. For example, in some embodiments, the transistor Q9 can be implemented as a PNP transistor, and the transistor Q10 can be implemented as an NPN transistor. However, it will be understood that different types and arrangements of switch elements can be used as desired. For example, the transistors Q9 and Q10, can be implemented as NPN-type or PNP type BJTs (as illustrated), FETs, MOSFETs, IGBTs, etc. In addition, in some embodiments, the buffer circuit 306 can be implemented similar to the buffer circuit 302, described previously. Furthermore, it will be understood that the resistors 304, 308 can be implemented using other resistive elements, such as, but not limited to, transistors.

Similar to the floating bias circuit 104 described earlier, the floating bias circuit 106 can provide a voltage drop between two components of the system 100 (e.g., between the signal processing circuit 102 and the system power low source 110, between two floating bias circuits, and/or between a floating bias circuit and one of the signal processing circuit 102 and the system power low source 110). For example, in some embodiments, the floating bias circuit 106 can provide a 50% voltage drop between two components of the system 100.

In certain embodiments, the voltage level at the floating bias circuit 106 can be midway between the voltage level of the signal processing circuit 102 (or the voltage level of a proximate floating bias circuit 106 that is closer to the signal processing circuit 102) and the voltage level of the system power low source 110 (or the voltage level of a proximate floating bias circuit 106 that is closer to the system power low source 110). The difference between the voltage level of the signal processing circuit 102 and the voltage level of the system power low source 110 can also be referred to herein as the low source-circuit voltage difference.

By providing a voltage drop between two components of the system 100, the floating bias circuit 106 can reduce the voltage differential at the components of the signal processing circuit 102, thereby maintaining the components of the signal processing circuit 102 within their breakdown voltage threshold.

In addition, due to the configuration of the floating bias circuit 106, a variation in the voltage level at the signal processing circuit 102 (e.g., due to a data signal) can result in a voltage level change at the floating bias circuit 106. For example, if the voltage level at the signal processing circuit 102 increases/decreases by 5V, the voltage level at the floating bias circuit 106 can increase/decrease by 2.5V. In this way the voltage level of the floating bias circuit can remain midway, or approximately midway, between the voltage level at the signal processing circuit 102 and the voltage level at the system power low source 110, and can provide a higher voltage to the signal processing circuit 102.

As described in greater detail above with reference to floating bias circuit 104, the percentage of the low source-circuit voltage difference that is between the voltage level of each floating bias circuit can be calculated as 100/(number of floating bias circuits+1). Thus, if two floating bias circuits 106 are used between the signal processing circuit 102 and the system power low source 110, the percentage of the low source-circuit voltage difference between each floating bias circuit can be calculated as 33% or approximately 33%. Similarly, with three floating bias circuits between the signal processing circuit 102 and the system power low source 110, the percentage of the low source-circuit voltage difference between each floating bias circuit can be calculated as 25% or approximately 25%.

In addition, the size of the voltage step between each floating bias circuit that is between the signal processing circuit 102 and the system power low source 110 can be calculated as (low source-circuit voltage difference)/(number of floating bias circuits+1). In some embodiments, such as when an equal number of floating bias circuits is desired on either side of the signal processing circuit 102, a minimum number of floating bias circuits between the system power low source 110 and the signal processing circuit 102 can be calculated as (low source-circuit voltage difference)/(breakdown voltage threshold/2)−1. In certain embodiments, a maximum voltage step between each floating bias circuit that is between the signal processing circuit 102 and the system power low source 110 can be calculated based at least in part on the breakdown voltage of the components of the signal processing system 102 and/or the components of the floating bias circuits (e.g., as breakdown voltage threshold/2).

With continued reference to the 54V power supply example above with a symmetrical number of floating bias circuits on either side of the signal processing circuit 102, in some embodiments, the maximum voltage step can be calculated as 18V/2=9V, and the minimum number of floating bias circuits between the system power low source 110 and the signal processing circuit 102 can be calculated as (54−27)/(18/2)−1=2. Accordingly, the system 100 can include two floating bias circuits (third and fourth floating bias circuits) between the signal processing circuit 102 and the system power low source 110.

Similarly, the percentage of the low source-circuit voltage difference (27V) between the voltage level of the signal processing circuit 102 and the third floating bias circuit, between the third and fourth floating bias circuits, and between the fourth floating bias circuit and the system power low source 110 can be 33%, or 9V. Thus, the voltage level at the signal processing circuit 102 can be 27V, the voltage level at the third floating bias circuit can be 18V, and the voltage level at the fourth floating bias circuit can be 9V.

As the voltage of the data signal varies, the percentage of the low source-circuit voltage difference that is between circuits can remain relatively constant. For example, if the data signal voltage drops to 21V, the percentage of the low source-circuit voltage difference that is between the different circuits can remain at 33%. However, while the percentage of the low source-circuit voltage difference that is between the voltage level of the different circuits can remain relatively constant (e.g., 33%), the voltage step between the different circuits can change from 9V to 7V (e.g., (21−0)/(2+1)=7).

Accordingly, the floating bias circuits 104, 106 can be used to maintain the components of the signal processing circuit within the breakdown voltage threshold while extending the range of power supplies that can be used. As described above, a system using the floating bias circuits 104, 106 can effectively double the range of power supplies that can be used with the signal processing circuit 102. Additional floating bias circuits can be added to further extend the range of power supplies that can be used with the signal processing circuit while maintaining the components of the signal processing circuit within the breakdown voltage threshold. In some embodiments, the number of floating bias circuits between the signal processing circuit 102 and the system power high source 108 can be greater than or less than the number of floating bias circuits between the signal processing circuit 102 and the system power low source 110.

Figure 4:
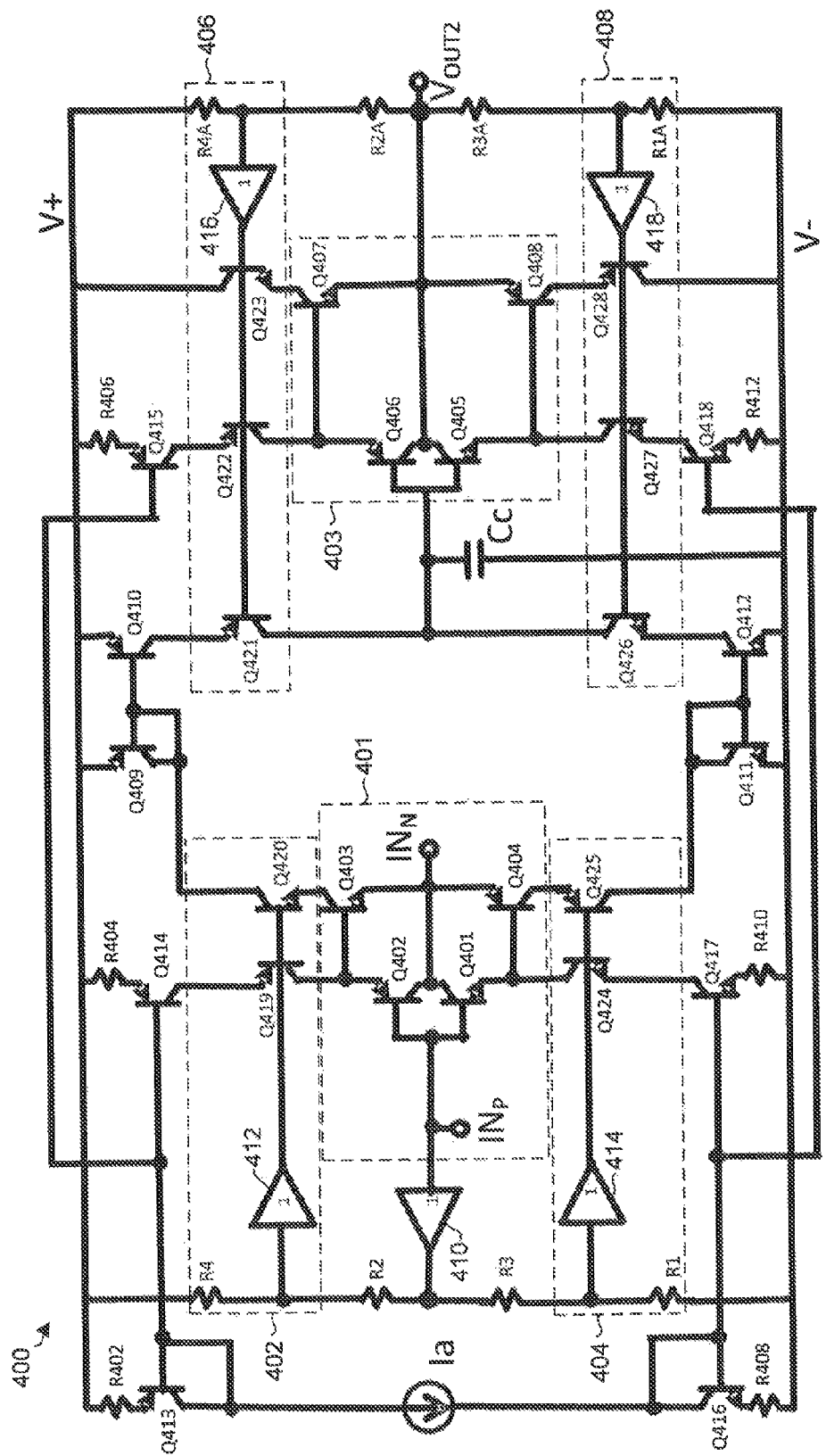
FIG. 4 is a circuit diagram illustrative of an embodiment of a current feedback amplifier including floating bias circuits at the input stage and floating bias circuits at the output stage.

FIG. 4, is a circuit diagram illustrative of an embodiment a system 400, including floating bias circuits 402, 404 at an input stage 401 and floating bias circuits 406, 408 at the output stage 403 of a circuit. In the illustrated embodiment of FIG. 4, the system 400 can include a circuit comprised of transistors Q401, Q402, Q403, Q404, Q405, Q406, Q407, Q408, Q409, Q410, Q411, Q412, Q413, Q414, Q415, Q416, Q418, resistors R402, R404, R406, R408, R410, R412, a capacitor Cc, and a current source Ia. The circuit can be configured to amplify a data signal based at least in part on the voltage of the data signal at the differential input nodes $IN_P$, $IN_N$, and output the amplified data signal at the output node $V_{OUT2}$. In some embodiments, the circuit can be configured to amplify the difference between the input nodes $IN_P$, $IN_N$. Furthermore, it will be understood that although the circuit is illustrated as a current feedback amplifier in FIG. 4, any number of different circuits or amplifier topologies can be used in conjunction with the floating bias circuits 402, 404, 406, 408, as desired.

In some embodiments, the floating bias circuits 402, 404, 406, 408 can increase the range of power supplies that can be used with the transistors in the circuit, while maintaining the transistors within their breakdown voltage threshold.

For example, in certain embodiments, the voltage level of the floating bias circuits 402, 404 can be configured to vary based at least in part on the voltage level of a data signal at the input stage 401 (e.g., at the input node $IN_P$ or at the input node $IN_N$). Accordingly, in some embodiments, the input to a buffer circuit 410 can be electrically coupled to the input node $IN_P$ (and/or, in some instances, to the input node $IN_N$). In certain embodiments, the output of the buffer circuit 410 can be electrically coupled to the floating bias circuits 402, 404 via resistors R2, R3 (or other resistive elements, such as transistors), respectively. In this manner, the voltage level of the floating bias circuits 402, 404 (e.g., at the input and/or output of the buffers 412, 414 of the floating bias circuits) can vary based at least in part on the voltage level of a data signal at a node in the input stage 401, while providing a fixed DC current and maintaining the components of the input stage 401 (e.g., transistors Q401, Q402, Q403, Q404 in the illustrated embodiment) within their breakdown voltage.

The floating bias circuit 402 can, in certain embodiments, be implemented similar to the floating bias circuit 104 described previously with reference to FIG. 3. For example, the floating bias circuit 402 can be electrically coupled to the input stage 401 (an embodiment of the signal processing circuit 102) and the system power high source V+, and can include the buffer circuit 412 similar to the buffer circuit 302, the transistors Q419, Q420 similar to the transistors Q7, Q8, respectively, and the resistor R4 similar to the resistor 304.

As illustrated, in some embodiments, the input to the buffer circuit 412 can be electrically coupled to the system power high source V+ via resistor R4 and can be electrically coupled to the output of the buffer circuit 410 (or the input stage 401) via the resistor R3. Furthermore, in certain embodiments, the transistor Q419 can be electrically coupled to the output of a current mirror (e.g., comprised of transistors Q413, Q414 in the illustrated embodiment) and to a component of the input stage 401 (e.g., the transistor Q402 in the illustrated embodiment), and the transistor Q420 can be electrically coupled to a component of the input stage 401 (e.g., the transistor Q403 in the illustrated embodiment) and to the input of a current mirror (e.g., comprised of transistors Q409, Q410 in the illustrated embodiment).

In addition, the floating bias circuit 404 can be implemented similar to the floating bias circuit 106 described previously with reference to FIG. 3. For example, the floating bias circuit 404 can be electrically coupled to the input stage 401 (an embodiment of the signal processing circuit 102) and the system power low source V−, and can include the buffer circuit 414 similar to the buffer circuit 306, the transistors Q424, Q425 similar to the transistors Q9, Q10, respectively, and the resistor R1 similar to the resistor 308.

As illustrated, in certain embodiments, the input to the buffer circuit 414 can be electrically coupled to the system power low source V− via resistor R1 and can be electrically coupled to the output of the buffer circuit 410 (or the input stage 401) via the resistor R3. In some embodiments, the transistor Q424 can be electrically coupled to the output of a current mirror (e.g., comprised of transistors Q416, Q417) and to a component of the input stage 401 (e.g., the transistor Q401 in the illustrated embodiment), and the transistor Q425 can be electrically coupled to a component of the input stage 401 (e.g., the transistor Q404 in the illustrated embodiment) and to a current mirror (e.g., comprised of transistors Q411, Q412 in the illustrated embodiment).

Furthermore, the system 400 can include the floating bias circuits 406, 408, which can be configured to have voltage levels (e.g., at the input and/or output of the buffers 416, 418 of the floating bias circuits) that vary based at least in part on the voltage level of the data signal at a node of the output stage 403 (e.g., at the output node $V_{OUT2}$ or some other node). Accordingly, in some embodiments, the output node $V_{OUT2}$ (or some other node) can be electrically coupled to the floating bias circuits 406, 408 via resistors R2A, R3A (or other resistive elements, such as transistors), respectively. In this manner, the voltage level of the floating bias circuits 406, 408 can vary based at least in part on the voltage level of a data signal at a node in the output stage 401, while providing a fixed DC current and maintaining the components of the output stage 403 (e.g., transistors Q405, Q406, Q407, Q408 in the illustrated embodiment) within their breakdown voltage.

In some embodiments, the floating bias circuit 406 can be implemented similar to the floating bias circuit 402, described previously, but electrically coupled to the output stage 403 (an embodiment of the signal processing circuit 102) instead of the input stage 401. For example, the floating bias circuit 406 can include the buffer circuit 416 similar to the buffer circuit 412, the transistors Q422, Q423, similar to the transistors Q419, Q420, respectively, and the resistor R4A, similar to resistor R4. Additionally, in certain embodiments, the floating bias circuit 406 can include the transistor Q421 to enable the voltage level at the input to the output stage 403 to vary based at least in part on the voltage level at the output node $V_{OUT2}$.

The input to the buffer circuit 416, in some instances, can be electrically coupled to the system power high source V+ via resistor R4A and can be electrically coupled to the output stage 403 (e.g., to the output node $V_{OUT2}$) via the resistor R2A. In some embodiments, the transistor Q421 can be electrically coupled to the output of a current mirror (e.g., comprised of transistors Q409, Q410 in the illustrated embodiment), and to a node that is electrically coupled to the input of the output stage 403 and the capacitor Cc. In certain embodiments, the transistor Q422 can be electrically coupled to the output of a current mirror (e.g., comprised of transistors Q413, Q415 in the illustrated embodiment) and to a component of the output stage 403 (e.g., the transistor Q406 in the illustrated embodiment). In some embodiments, the transistor Q423 can be electrically coupled to a component of the output stage 403 (e.g., to the transistor Q407 in the illustrated embodiment) and to the system power high source V+.

In some embodiments, the floating bias circuit 408 can be implemented similar to the floating bias circuit 404, described previously, but electrically coupled to the output stage 403 (an embodiment of the signal processing circuit 102) instead of the input stage 401. For example, the floating bias circuit 406 can include the buffer circuit 418 similar to the buffer circuit 414, the transistors Q427, Q428, similar to the transistors Q424, Q425, respectively, and the resistor R1A, similar to resistor R1. Additionally, in certain embodiments, the floating bias circuit 406 can include the transistor Q426 to enable the voltage level at the input to the output stage 403 to vary based at least in part on the voltage level at the output node $V_{OUT2}$.

The input to the buffer circuit 418, in some instances, can be electrically coupled to the system power low source V− via resistor R1A and can be electrically coupled to the output stage 403 (e.g., to the output node $V_{OUT2}$) via the resistor R3A. In some embodiments, the transistor Q426 can be electrically coupled to the output of a current mirror (e.g., comprised of transistors Q411, Q412 in the illustrated embodiment), and to a node that is electrically coupled to the input of the output stage 403 and the capacitor Cc. In certain embodiments, the transistor Q427 can be electrically coupled to the output of a current mirror (e.g., comprised of the transistors Q408, Q418 in the illustrated embodiment) and to a component of the output stage 403 (e.g., the transistor Q405 in the illustrated embodiment). In some embodiments, the transistor Q428 can be electrically coupled to a component of the output stage 403 (e.g., to the transistor Q408 in the illustrated embodiment) and to the system power low source V−.

As described previously, with reference to floating bias circuit 102, 104, it will be understood that the floating bias circuits 402, 404, 406, 408 can be implemented using a variety of types of components and can include fewer or more components. Furthermore, the various components of of the floating bias circuits 402, 404, 406, 408 can be electrically coupled to different circuits and/or components, etc. For example, in embodiments where multiple floating bias circuit are implemented between the input stage 401 and/or output stage 403 and the system power high source V+ and/or the system power low source V−, the components of the floating bias circuits 402, 404, 406, 408 can be electrically coupled with other floating bias circuits, etc.

Figure 5:
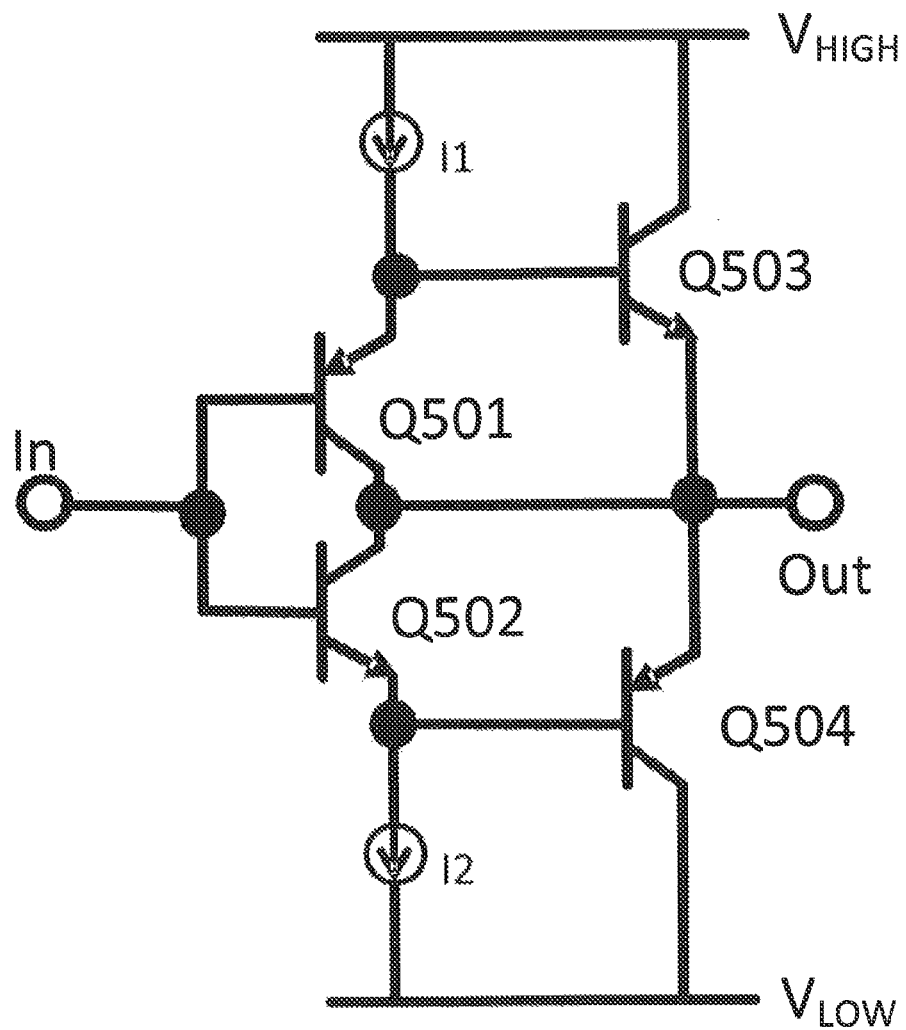
FIG. 5 is a circuit diagram illustrative of an embodiment of a buffer circuit for use in conjunction with the floating bias circuits.

FIG. 5 is a circuit diagram illustrative of an embodiment of a buffer circuit 500 for use in conjunction with the floating bias circuits. For example, in some instances, the buffer circuit 500 can be used to implement the buffer circuits 302, 306, 410, 412, 414, 416, 418. However, as mentioned previously, the buffer circuits 302, 306, 410, 412, 414, 416, 418 can be implemented using a variety of components and buffer circuit topologies and are not limited to the embodiment illustrated in FIG. 5.

In the illustrated embodiment of FIG. 5, the buffer circuit 500 can include switch elements, shown as transistors Q501, Q502, Q503, Q504, current sources I1, I2, an input node In, and an output node Out. Although the transistors Q501, Q504 are illustrated as PNP-type BJTs and transistors Q502, Q503 are illustrated as NPN-type BJTs in FIG. 5, it will be understood that the transistors Q501, Q502, Q503, Q504 can be implemented using any number of transistor topologies, such as, but not limited to, PNP-type transistors, NPN-type transistors, MOSFETs, FETs, IBGTs, JFETs, etc.

The buffer circuit 500 can be coupled with a first voltage source $V_{HIGH}$ and a second voltage source $V_{LOW}$. The first voltage source $V_{HIGH}$ can correspond to the system power high source 108, the voltage level of a floating bias circuit, the voltage level at a node of the signal processing circuit 102, a voltage bias, and/or the voltage level of some other node in the system 100, based at least in part on the location of the buffer circuit 500 and the number of floating bias circuits in the system 100. Similarly, the second voltage source $V_{LOW}$ can correspond to the system power low source 110, the voltage level of a floating bias circuit, the voltage level at a node of the signal processing circuit 102, a voltage bias, and/or the voltage level of some other node in the system 100, based at least in part on the location of the buffer circuit 500 and the number of floating bias circuits in the system 100. For example, if the buffer circuit 500 is used to implement the buffer circuit 418, the first voltage source $V_{HIGH}$ can correspond to the voltage level at the output node $V_{OUT2}$ and the second voltage source $V_{LOW}$ can correspond to the system power low source V− voltage. Similarly, if the buffer circuit 500 is used to implement the buffer circuit 412, the first voltage source $V_{HIGH}$ can correspond to the system power high V+ voltage and the second voltage source $V_{LOW}$ can Correspond to the Voltage Level at the Input Node $IN_P$.

In some instances, the base/gate of the transistors Q501, Q502 can be electrically coupled to each other and to an input node In. In certain embodiments, the emitter/source of the transistor Q501 can be electrically coupled with the current source I1 (or in some embodiments to the first voltage source $V_{HIGH}$) and the base/gate of the transistor Q503, and the emitter/source of the Q502 can be electrically coupled with the current source I2 (or in some embodiments to the second voltage source $V_{LOW}$) and the base/gate of the transistor Q504. In certain embodiments, the collector/drain of the transistors Q503, Q504 can be electrically coupled with the first voltage source $V_{HIGH}$ and the second voltage source $V_{LOW}$, respectively. In such embodiments, the collector/drain of the transistors Q501, Q502 can be electrically coupled with each other, with the emitter/source of the transistors Q503, Q504, and with the output node Out.

As mentioned previously, the transistors Q501, Q502, Q503, Q504 can be arranged in a variety of ways to implement the buffer circuit 500. Furthermore, one skilled in the art will understand that fewer or more components (e.g., transistors, resistors, capacitors, operational amplifiers, etc.) can be used to implement the buffer circuit 500 as desired without departing from the scope of the description. For example, in some embodiments, the buffer circuit 500 may not include the current sources I1, I2.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. An apparatus comprising:
   a first internal rail voltage circuit, the first internal rail voltage circuit configured to receive a first power supply voltage and to provide a first internal power supply voltage to a signal processing circuit that varies based at least in part on a change in voltage of a data signal associated with the signal processing circuit; and
   a second internal rail voltage circuit configured to receive a second power supply voltage and to provide a second internal power supply voltage to the signal processing circuit that varies based at least in part on the change in the voltage of the data signal associated with the signal processing circuit, wherein the first internal power supply voltage and the second internal power supply voltage power the signal processing circuit.

2. The apparatus of claim 1, wherein the signal processing circuit comprises transistors.

3. The apparatus of claim 1, wherein the first internal rail voltage circuit comprises a switch and a resistor.

4. The apparatus of claim 3, wherein the first internal rail voltage circuit further comprises a buffer.

5. The apparatus of claim 3, wherein the second internal rail voltage circuit comprises a switch and a resistor.

6. The apparatus of claim 5, wherein the first internal rail voltage circuit and the second internal rail voltage circuit each comprise a buffer.

7. The apparatus of claim 1, wherein a voltage level at the first internal rail voltage circuit is approximately halfway between the first power supply voltage and the voltage of the data signal associated with the signal processing circuit.

8. The apparatus of claim 7, wherein a voltage level at the second internal rail voltage circuit is approximately halfway between the second power supply voltage and a voltage of the data signal associated with the signal processing circuit.

9. The apparatus of claim 1, wherein a voltage difference between the first internal rail voltage circuit and the voltage of the data signal associated with the signal processing circuit is at most half of a breakdown voltage threshold of one or more components of the signal processing circuit.

10. The apparatus of claim 9, wherein a voltage difference between the second internal rail voltage circuit and the voltage of the data signal associated with the signal processing circuit is at most half of the breakdown voltage threshold of one or more components of the signal processing circuit.

11. The apparatus of claim 1, wherein a voltage difference between the first power supply voltage and the second power supply voltage is greater than a breakdown voltage threshold of one or more components of the signal processing circuit.

12. The apparatus of claim 1, wherein a voltage difference between the first internal power supply voltage and the second internal rail voltage circuit is less than or equal to a breakdown voltage threshold of one or more components of the signal processing circuit.

13. The apparatus of claim 1, further comprising:
   a third internal rail voltage circuit electrically coupled to the first internal rail voltage circuit, wherein the third internal rail voltage circuit is configured to receive a third power supply voltage and provide the first power supply voltage to the first internal rail voltage circuit, wherein the first power supply voltage varies based at least in part on a change in the voltage of the data signal; and
   a fourth internal rail voltage circuit electrically coupled to the second internal rail voltage circuit, wherein the fourth internal rail voltage circuit is configured to receive a fourth power supply voltage and provide the second power supply voltage to the second internal rail voltage circuit, wherein the second power supply voltage varies based at least in part on a change in the voltage of the data signal.

14. The apparatus of claim 13, wherein the third internal rail voltage circuit is coupled to a first power supply and receives the third power supply voltage from the first power supply and the fourth internal rail voltage circuit is coupled to a second power supply and receives the fourth power supply voltage from the second power supply.

15. The apparatus of claim 1, wherein at least one of
   a voltage level at the first internal rail voltage circuit is approximately halfway between the first power supply voltage and the voltage of the data signal associated with the signal processing circuit, or
   a voltage level at the second internal rail voltage circuit is approximately halfway between the second power supply voltage and a voltage of the data signal associated with the signal processing circuit.

16. The apparatus of claim 1, wherein
   a voltage level at the first internal rail voltage circuit is approximately halfway between the first power supply voltage and the voltage of the data signal associated with the signal processing circuit, and
   a voltage level at the second internal rail voltage circuit is approximately halfway between the second power supply voltage and a voltage of the data signal associated with the signal processing circuit.

17. The apparatus of claim 1, wherein a voltage difference between the first internal rail voltage circuit and the voltage of the data signal associated with the signal processing circuit satisfies a breakdown voltage threshold of one or more components of the signal processing circuit.

18. The apparatus of claim 1, wherein a voltage difference between the first internal power supply voltage and the second internal rail voltage circuit is less than or equal to a breakdown voltage threshold of one or more components of the signal processing circuit.

19. A method for increasing a voltage range of a signal processing circuit, the method comprising:
receiving a first power supply voltage at a first internal rail voltage circuit;
providing, using the first internal rail voltage circuit, a first internal power supply voltage for a signal processing circuit based at least in part on the received first power supply voltage, wherein the first internal power supply voltage varies based at least in part on a change in a voltage of an output of the signal processing circuit; and
providing a second internal power supply voltage from a second internal rail voltage circuit for the signal processing circuit, wherein the second internal power supply voltage varies based at least in part on the change in the voltage of the output of the signal processing circuit, wherein the second internal rail voltage circuit is electrically coupled to the signal processing circuit and configured to receive a second power supply voltage, wherein the first internal power supply voltage and the second internal power supply voltage power the signal processing circuit.

20. The method of claim 19, wherein the first internal power supply voltage is less than the first power supply voltage and the second internal power supply voltage is greater than the second power supply voltage.

21. The method of claim 19, wherein
the first internal power supply voltage is approximately halfway between the first power supply voltage and a voltage of a data signal associated with the signal processing circuit, and
the second internal power supply voltage is approximately halfway between the second power supply voltage and the voltage of the data signal associated with the signal processing circuit.

22. The method of claim 19, wherein a voltage difference between the first internal power supply voltage and a voltage of a data signal associated with the signal processing circuit is at most half of a breakdown voltage threshold of one or more components of the signal processing circuit.

23. The method of claim 22, wherein a voltage difference between the second internal power supply voltage and the voltage of the data signal associated with the signal processing circuit is at most half of the breakdown voltage threshold of one or more components of the signal processing circuit.

24. The method of claim 19, wherein a voltage difference between the first power supply voltage and the second power supply voltage is greater than a breakdown voltage threshold of one or more components of the signal processing circuit.

25. The method of claim 19, wherein a voltage difference between the first internal power supply voltage and the second internal power supply voltage is less than or equal to a breakdown voltage threshold of one or more components of the signal processing circuit.

26. An apparatus, comprising:
one or more first internal rail voltage circuits electrically coupled to a first power supply source and a signal processing circuit, the signal processing circuit comprising a plurality of components having a breakdown voltage threshold; and
one or more second internal rail voltage circuits electrically coupled to a second power supply source and the signal processing circuit,
wherein each of the one or more first internal rail voltage circuits and the one or more second internal rail voltage circuits are configured to provide a distinct internal power supply voltage that varies in proportion to a change in a voltage of a data signal, wherein a difference between a first internal power supply voltage provided by a first internal rail voltage circuit of the one or more first internal rail voltage circuits and a second internal power supply provided by a second internal rail voltage circuit of the one or more second internal rail voltage circuits satisfies the breakdown voltage threshold, and wherein the first internal power supply voltage and the second internal power supply voltage power the signal processing circuit.

27. An apparatus, comprising:
a first internal rail voltage circuit electrically coupled to a first power supply source and a first set of switches of a signal processing circuit, wherein the first internal rail voltage circuit is configured to provide a first internal power supply voltage that varies in proportion to a change in a voltage of a data signal; and
a second internal rail voltage circuit electrically coupled to a second power supply source and a second set of switches of the signal processing circuit, wherein the second internal rail voltage circuit is configured to provide a second internal power supply voltage that varies in proportion to the change in the voltage of the data signal, wherein the first internal power supply voltage and the second internal power supply voltage power the signal processing circuit.

* * * * *